United States Patent [19]

McCormack

[11] 4,177,353
[45] Dec. 4, 1979

[54] RFI SHIELDED DOORS WITH INFLATABLE GASKETS

[75] Inventor: Ray G. McCormack, St. Joseph, Ill.

[73] Assignee: The United States of America as represented by the Secretary of the Army, Washington, D.C.

[21] Appl. No.: 778,911

[22] Filed: Mar. 18, 1977

[51] Int. Cl.² ............. F16J 15/46; H05K 9/00
[52] U.S. Cl. ................. 174/35 GC; 49/477;
 277/34; 174/35 MS
[58] Field of Search ............ 174/35 MS, 35 GC;
 277/34.3, 34, 34.6; 49/477; 220/232

[56] References Cited

U.S. PATENT DOCUMENTS

| 2,507,360 | 5/1950 | Wicks | 49/477 X |
|---|---|---|---|
| 2,757,225 | 7/1956 | Dunn | 174/35 MS |
| 3,074,520 | 1/1963 | Grubelich | 174/35 MS |
| 3,390,491 | 7/1968 | Hayden et al. | 174/35 MS |
| 3,413,406 | 11/1968 | Plummer | 174/35 GC |
| 3,507,974 | 4/1970 | Clark et al. | 174/35 MS |
| 3,518,355 | 6/1970 | Luce | 174/35 MS |
| 3,812,316 | 5/1974 | Milburn | 174/35 GC |
| 3,828,116 | 8/1974 | Lonow | 277/34.3 |

OTHER PUBLICATIONS

Draffan, G. L., "How to Tame 750-KV with Second-Hand Tire Tubes", Electrical World, vol. 155, No. 14, Apr. 3, 1961, p. 64.

Primary Examiner—Bruce A. Reynolds
Assistant Examiner—D. A. Tone
Attorney, Agent, or Firm—Thomas O. Maser

[57] ABSTRACT

A gasket structure for the door frame of an electromagnetically shielded enclosure having a flexible inflatable tube with a sleeve or coating of conducting material which upon inflation with the door closed provides intimate electrical contact between the door and the door frame.

2 Claims, 8 Drawing Figures

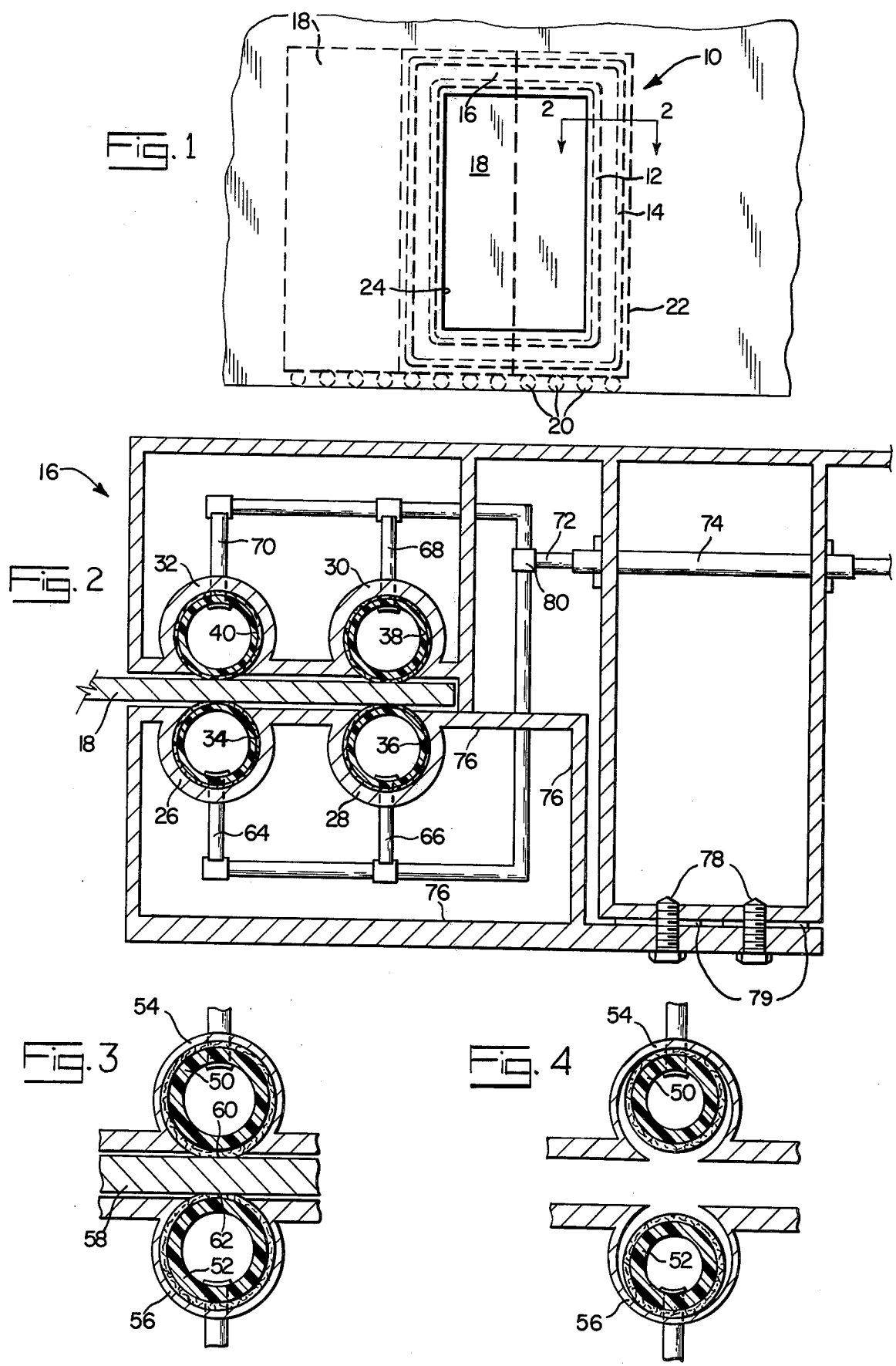

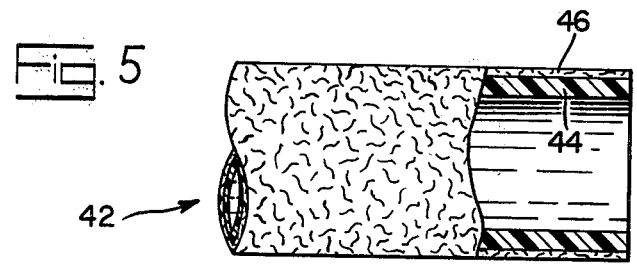
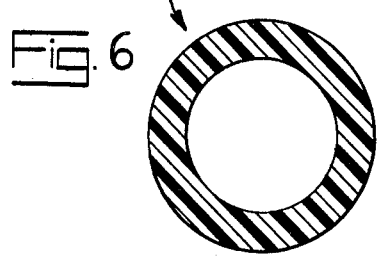
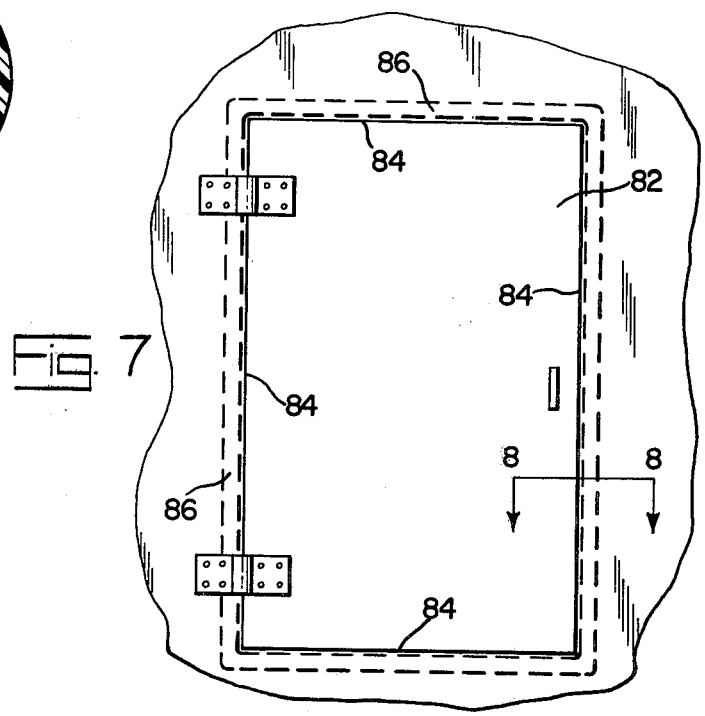
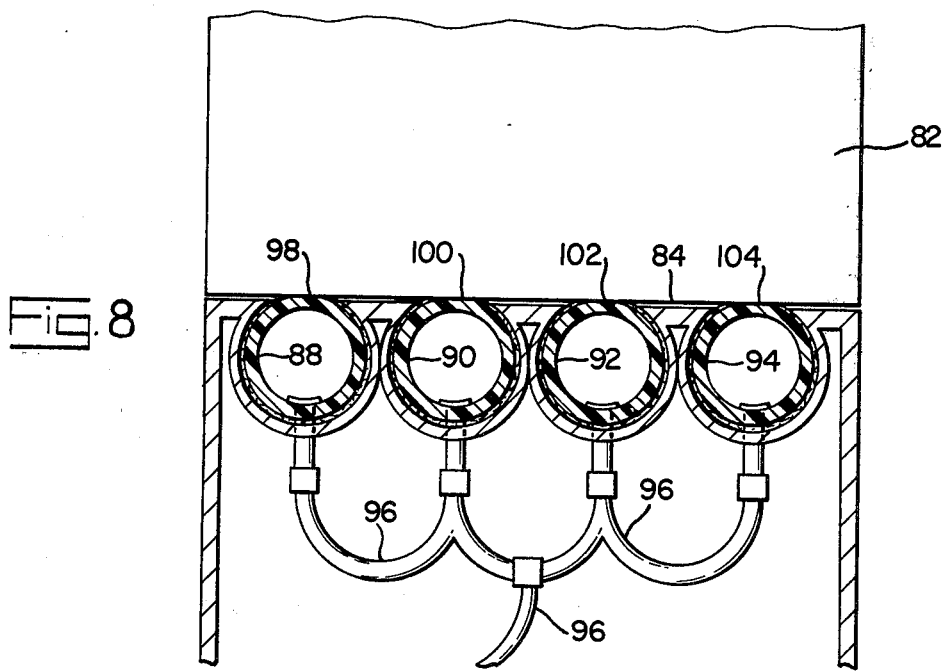

RFI SHIELDED DOORS WITH INFLATABLE GASKETS

BACKGROUND OF THE INVENTION

This invention relates to a gasket structure and the use thereof in a door structure for electromagnetically shielded enclosures, particularly radio frequency (RF) shielded enclosures.

A problem in the use of electromagnetic or radio shielded enclosures has involved the loss of shielding effectiveness due to the thin space between the door providing access to the enclosure and the door frame.

One approach to solving this problem involves the use of brass finger stock (thin brass with a row of curved fingers at one edge which make contact with the door and frame surfaces when the door is closed). Often an extended door edge in the form of a "knife edge" is used to mate with two strips of finger stock in a channel around the periphery of the door. When the door is closed, the "knife edge" is forced between opposing strips of finger stock in the channel which is mounted to the door stops. The only possibility for leakage of electromagnetic energy through the door is between the knife edge and the finger stock. When the finger stock has adequate spring tension and all mating surfaces are properly cleaned, this technique of shielding is adequate for many applications. After repeated usage, however, the finger stock tends to loose spring tension and surfaces become worn, corroded, and dirty with often a severe reduction in shielding effectiveness of the door. Therefore, maintenance is necessary to clean or replace the finger stock and/or knife edge to assure the desired level of shielding.

Another type of door which has seen considerable usage in recent years is an air expandable door which eliminates many of the problems of the door using brass finger stock. This door uses two panels at opposite surfaces of the door in an assembly which slides on rollers within a door frame. When the door is closed, air inflatable bladders within the door assembly are used to move the door panels away from each other and into contact with the door frame. Shielding is dependent upon continuous contact along the entire mating surfaces between the door panels and frame. In order to assure uniform contact, at least thirty PSI pressure is required on the door panels. Each panel mates with a door frame member around its entire periphery with the frame member width being about four inches. The total contact area is nearly 300 square inches for each door panel. The total force on the door frame is, therefore, approximately 18,000 pounds. Due to this high force level, the entire door and frame assembly must be constructed of very sturdy material, and is therefore quite heavy and expensive.

A third commonly used approach to providing sealing around doors for shielded enclosures involves the use of specially prepared gaskets between the door and the door frame. A mechanical means is used to provide pressure on the gasket so that the electrical conductivity through door surface, gasket and frame surface is as high as possible. A type of gasket often used is a tubular mesh gasket which is flattened between the door and frame. A disadvantage of this approach is that continued usage results in loss of the resiliency of the gasket with permanent deformation in a flattened state and reduction of conductivity when the door is closed. In addition, the pressure required is high so that the entire assembly must be sturdily constructed in order to assure adequate pressure.

Other structures have made use of inflatable members to press contacting members into engagement with door frames. The U.S. Pat. to Clark No. 3,507,974 uses inflatable tubing with flexible finger stock but use of the delicate finger stock here involves the same disadvantages discussed above with relation to the use of finger stock alone, i.e. loss of spring tension (which is needed here to disengage the door frame) and surface wear, corrosion and dirt accumulation.

The U.S. Pat. to Dunn No. 2,757,225 shows the use of inflatable tubing with thin flexible sheet metal as the contact member pressed so as to engage opposing metal sheeted surfaces.

SUMMARY OF THE INVENTION

An object of this invention is to provide a shielding gasket structure which will establish continuous intimate electrical contact about the entire periphery of a shielded enclosure's door between the door and frame thus assuring attenuation of radiated electromagnetic energy.

A further object is to achieve continuous intimate electrical contact despite imperfections in the flatness of the door and door frame surfaces.

Another object is to achieve continuous intimate electrical contact with surface contact occuring only in a small total area so that the total pressure exerted is much less permitting the door structure to be constructed of lighter materials and to be, consequently, less massive.

A further object is to provide a structure which will wear better and require less maintenance.

These objects and others not specifically enumerated are achieved by a gasket structure having an inflatable electrically conductive gasket which is inflated when the door of an electromagnetically shielded enclosure is closed so as to provide intimate electrical contact between the door and its door frame about the entire periphery of the door. The gasket is tubular in form and may be a flexible inflatable tube having a flexible sleeve of conducting material such as a metal mesh sleeve or the flexible inflatable tube itself may be made of an electrically conductive elastomeric material. The gasket is mounted between the closed door and the door frame in an electrically conductive tube having a longitudinally extending portion thereof removed to permit contact between the door and the gasket. Although one of the gaskets about the door will provide shielding, more effective shielding can be achieved by mounting a plurality of gaskets about the door positioning some on each side of the door when the door is a pocket door. This gasket structure may also be used with a hinged door.

DESCRIPTION OF THE DRAWINGS

FIG. 1 is a front elevational view of a shielded door structure having the gasket structure of this invention.

FIG. 2 is an enlarged fragmentary sectional view taken along lines 2—2 of FIG. 1.

FIG. 3 is a fragmentary sectional view showing the gasket structure of this invention with the door closed and the gaskets inflated.

FIG. 4 is a view similar to FIG. 3 showing the door open and the gaskets deflated.

FIG. 5 is a partial side elevational view of a gasket having a metal mesh sleeve.

FIG. 6 is a transverse sectional view showing an alternative gasket structure.

FIG. 7 is a front elevational view similar to FIG. 1 showing the application of the gasket structure of this invention to a hinged door.

FIG. 8 is an enlarged fragmentary sectional view taken along lines 8—8 of FIG. 7.

DETAILED DESCRIPTION

FIG. 1 shows a pocket door structure 10 for an electromagnetically shielded enclosure having a shielding gasket structure 12, 14 which extends completely around the door frame 16. The door 18 is shown in closed and partially open positions and is mounted on rollers 20 to facilitate movement. The door periphery 22 overlaps the door opening 24 so that when closed the door periphery 22 remains within the door frame 16. Both the door 18 and the door frame 16 are ferromagnetic or metal and provide electromagnetic shielding.

The door frame 16 is shown in cross section in FIG. 2 with the door 18 in the closed position. Located about the door 18 are four electrically conductive mounting tubes 26, 28, 30 and 32 positioned adjacent the door 18 and in electrical contact with the door frame 16. The longitudinally extending portion of each of these tubes 26, 28, 30 and 32 immediately adjacent the door 18 has been removed. Positioned within each conductive mounting tube 26, 28, 30, 32 are flexible inflatable electrically conductive gaskets 34, 36, 38, 40. The structure of these gaskets 34, 36, 38, 40 is best shown by the gasket 42 in FIG. 5. Each gasket has a flexible inflatable tube 44 on the inside thereof and a flexible tubular sleeve 46 of metal mesh about the inflatable tube 44. This metal mesh is not dimensionally rigid but is stretchable and is able to expand and contract as the flexible inflatable tube 44 is inflated and deflated. The sleeve 46 need not be of metal mesh but can be of any conducting material. More broadly, the gasket may be flexible inflatable tube having any type of electrically conductive outer surface, coat or sleeve. Alternatively, the gasket may be a flexible inflatable tube made entirely from an electrically conductive elastomeric material such as a silver/silicone elastomer as shown in gasket 48 of FIG. 6.

The function of the gaskets 34, 36, 38, 40 in cooperation with their mounting tubes 26, 28, 30, 32 and the door 18 can be more clearly understood by reference to FIGS. 3 and 4 which show a pair of gaskets 50, 52 and their mounting tubes 54, 56 cooperating with a door 58. The door 58 is shown closed and the gaskets 50, 52 inflated in FIG. 3. The door 58 is ferromagnetic or metal and provides electromagnetic shielding, and the door frame (not shown) to which the mounting tubes 54, 56 are electrically connected is also ferromagnetic or metal and also provides such shielding. The inflated electrically conductive gaskets 50, 52 contact the door 58 about its entire periphery thus providing intimate electrical contact and thus electromagnetic shielding between the door 58 and the door frame (not shown). In order for electromagnetic energy to leak through the door 58, it would have to pass by each gasket to door interface 60, 62. Due to the flexibility of the gaskets 50, 52 no problem is presented by irregularities in the door surface to which the gaskets 50, 52 can easily conform. Also since the gasket to door interfaces 60, 62 comprise only a small area no problems are presented by a large total pressure caused by a large area of surface-to-surface contact.

To open the door 58 the gaskets 50, 52 are deflated thus contracting the gaskets 50, 52 and reducing them in cross-sectional size. This breaks the contact with the door 58 which permits the unhindered manipulation of the door 58. The gaskets 50, 52 are shown deflated and the door 58 opened in FIG. 4.

The gaskets are inflated and deflated using a pneumatic system. As shown in FIG. 2 extending through the mounting tubes 26, 28, 30, 32 into the gaskets 34, 36, 38, 40 are pneumatic lines 64, 66, 68, 70 all of which connect to a single pneumatic line 72 which leads to a master control valve and a supply of compressed air or other compressed gas (not shown). The pneumatic lines 64, 66, 68, 70 may be installed in their respective gaskets 34, 36, 38, 40 in the same manner that the air valve is installed in an automotive inner tube. This type valve (not shown) uses a cylinder or tube with a flange at one end. This flange is positioned inside of and vulcanized into the tube's inside surface with the valve tube or cylinder penetrating the wall of the tube. A threaded screw-on fitting (not shown) may then be used to attach each pneumatic line 64, 66, 68, 70 to its valve.

When inflated, the pressure of the gaskets 34, 36, 38, 40 would prevent the door 18 opening so the gaskets 34, 36, 38, 40 must be deflated to open or close the door 18. A control mechanism (not shown) is included to prevent the gaskets 34, 36, 38, 40 from inflating unless the door 18 is closed.

The pneumatic lines can be routed through the walls without compromising the shielding effectiveness. This is accomplished by using metal tubes to encase the pneumatic lines such as the one shown at 74. The diameter of these tubes 74 will be small relative to the wave length of frequencies for which the shielded enclosure is effective and, thus, the tubes 74 will act as wave guides below cutoff. The attenuation of these tubes 74 will, therefore, be much greater than the overall shielding effectiveness of the enclosure.

On one side of the door frame 16 of FIG. 2 the gasket structure is mounted within a bolt-on framework 76 which can be removed by unscrewing the bolts 78 to allow maintenance and replacement of parts. The bolts 78 may also support the gaskets 79. For removal, the pneumatic system would be disconnectable by means of an appropriate fitting 80. Periodic replacement of the gaskets 34, 36, 38, 40 would be required but the intervals would be long.

The use of the gasket structure of this invention is not limited to pocket doors. A modified structure may be used with a hinged, swinging door as shown in FIGS. 7 and 8. A hinged door 82 when closed has positioned about its edge 84 a gasket structure 86 with gaskets 88, 90, 92, 94 which upon inflation via the system of pneumatic lines 96 contact the door edge 84 at points 98, 100, 102, 104 about the entire periphery of the door. This structure has the advantage that when the door 82 is hinged open, the gaskets 88, 90, 92, 94 can be easily reached for maintenance and replacement.

With whatever type door the gaskets can be used singly with only one complete peripheral gasket or with a plurality of gaskets where the use of additional gaskets increases the shielding effectiveness of the door.

With a plurality of gaskets used with a pocket door, part may be positioned on one side of the door with the remainder on the other as in FIG. 2. It is believed that the arrangement of gaskets in FIGS. 2 and 8 will provide more than adequate shielding for most applications, since previous gasket evaluations have shown that four gaskets "in series" will provide more than 120 db of shielding effectiveness over the required frequency range.

Although these embodiments have shown the gasket structure located in the door frame, the gasket structure's application is not so limited. The gasket structure could also be door mounted with the inflated gaskets contacting the door frame.

While this invention has been described as having a preferred design, it will be understood that it is capable of further modification. This application, is, therefore, intended to cover any variations, uses, or adaptations of the invention following the general principles thereof and including such departures from the present disclosure as come within known or customary practice in the art to which this invention pertains, and as may be applied to the essential features hereinbefore set forth and fall within the scope of this invention or the limits of the claims.

What is claimed is:

1. In combination, a shielded enclosure having a cooperating door and door frame; and
   a gasket structure, comprising:
   a flexible inflatable tube made from an electrically conductive elastomeric material and fixedly mounted about the entire periphery of the door frame such that it is between the door and the door frame when the door is closed; and
   means for inflating said tube thereby causing said tube to make continuous electrical contact with both the door and the door frame when the door is closed.

2. A gasket for a shielded enclosure door structure, comprising a flexible inflatable tube made from an electrically conductive elastomeric material.

* * * * *